United States Patent [19]
Marshall et al.

[11] 3,983,075
[45] Sept. 28, 1976

[54] COPPER FILLED CONDUCTIVE EPOXY

[75] Inventors: David W. Marshall, North Reading; Jagdish Chandra Agarwal, Concord, both of Mass.

[73] Assignee: Kennecott Copper Corporation, New York, N.Y.

[22] Filed: June 21, 1974

[21] Appl. No.: 481,527

[52] U.S. Cl. ............................... 252/511; 252/503; 252/512; 260/37 M; 260/37 EP; 134/2; 134/26; 134/28
[51] Int. Cl.² ...................... H01B 1/02; H01B 1/06
[58] Field of Search ................... 252/503, 511, 512; 134/28, 26, 2, 15; 260/37 M

[56] References Cited
UNITED STATES PATENTS

| | | | |
|---|---|---|---|
| 2,795,680 | 6/1957 | Peck | 252/511 X |
| 3,345,225 | 10/1967 | Lacal | 134/28 |
| 3,686,139 | 8/1972 | Lubin | 252/511 |

*Primary Examiner*—Benjamin R. Padgett
*Assistant Examiner*—E. Suzanne Parr

[57] ABSTRACT

An electrically conductive resinous composition of a copper flake, the surface of which has been cleaned by removing therefrom impurities and/or oxides, a resinous binder, an amount of copper flake in said resinous composition being from 25 to 70 percent, the impurities in said copper flake being less than 7000 ppm, said resinous composition being cured with a curative comprising a polyamide or an anhydride, or mixtures thereof; these compositions are suitable for uses such as heating panels or conformable heating shapes.

7 Claims, 2 Drawing Figures

STABILITY OF A 28% COPPER—
7% CARBON FILLED HEATING PANEL

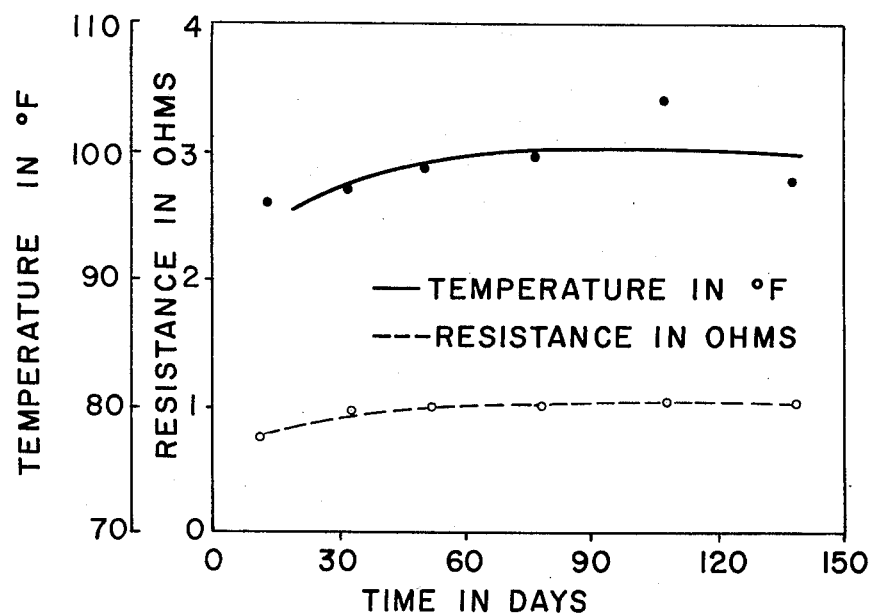
FIG. 1  STABILITY OF A 28% COPPER—
7% CARBON FILLED HEATING PANEL
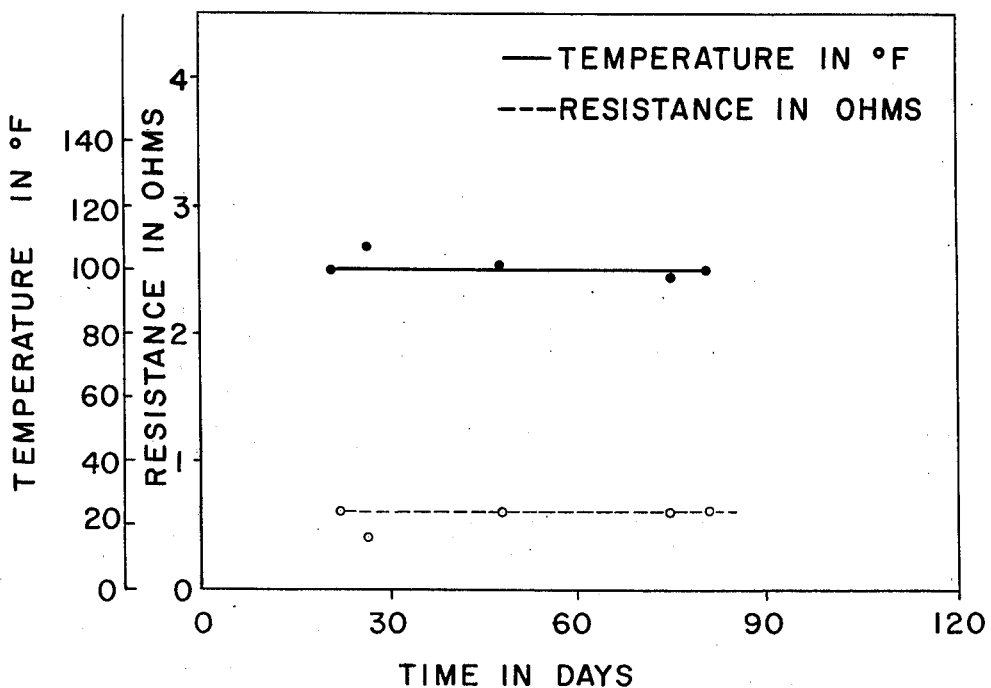
FIG. 2  STABILITY OF A 50% COPPER-FLAKE
—FILLED EPOXY HEATING PANEL

COPPER FILLED CONDUCTIVE EPOXY

This invention relates to an electrically conductive, cured epoxy resin filled with a certain percent, by weight, of copper flakes. The copper flakes are prepared in a manner whereby the electrical characteristics of the epoxy resin composition and the flakes do not change when the same are used over a prolonged period of time. More particularly, this invention relates to epoxy resin, which has been filled with copper flakes and cured with a curing agent especially suitable for avoiding the oxidation of the copper flakes in the epoxy resin matrix. The use of the copper flake filled resin in its cured state such as for purposes of radiant heating is within the scope of the invention. Still further, this invention relates to a method of preparing the copper flake particulate for its incorporation in the epoxy resin and the curing of the resin to avoid the undesirable property for the intended end use. As another aspect of this invention, a mixture of copper flake with carbon black for avoiding the local short circuiting has been indicated in the combination above.

BRIEF DESCRIPTION OF THE PRIOR ART

It has been a fairly long sought goal to provide an electrically conductive resinous composition, which would have substantially invarient properties and would utilize readily available materials to achieve the desired purpose. In the past, resinous compositions, which would have been made conductive by the incorporation of particulates, have fallen into two groups based on the ultimate performance of the resinous composition.

In the first group have been the carbon filled resinous composition whereby carbon has been employed of various types and qualities as well as sizes to provide the desired electrical conductivity. In U.S. Pat. No. 2,682,483, the various resistance characteristics of materials, especially the carbon based materials, are listed. Of the carbon materials, graphite and carbon black have been used in a colloidal form together with a colloidal metal such as gold, silver, and aluminum.

The second approach for obtaining conductive resinous compositions has consisted in using silver in its flake form in a resinous binder, sometimes in conjunction with an inert filler. The prior art with respect to this approach has been outlined in U.S. Pat. No. 3,412,043, however, as it can well be appreciated, silver has become a very expensive material for incorporation in conductive resin compositions. Although it has been mentioned in this patent that in the past, lower costs are achieved by conductive elemental copper powder having an electrolytically deposited coating of silver as a conductive ingredient, this combination has not been employed because of corrosiveness of copper and attendant conductivity decay.

Although in U.S. Pat. No. 3,412,043, it has been mentioned that the silver flake requires the use of a resinous binder and that the primary consideration for the conductivity is the silver to resin ratio and the secondary consideration is the particle size or type of the filler, it has been found that the teachings concerning silver cannot be readily transferred to copper flake because of relative noninertness of copper, vis-a-vis, silver.

Still further, in U.S. Pat. No. 3,278,455, a copper filled epoxy composition as a conductive material has been disclosed. Although the fully cured resin is made using a primary amine as a curative for the epoxy resin, the use of the excessive amount of curing agents as well as the effectiveness of the curing agent as the oxidant for copper flake has rendered the disclosed combination unacceptable, especially for a long duration application and use of the material for the purposes illustrated herein.

BRIEF DESCRIPTION OF THE INVENTION

It has now been found that in preparing electrically conductive resin compositions of epoxy resin and copper flake, the combination of the conductive material with the resin depends on certain critical elements, which must be taken into consideration before an acceptable electrically conductive resinous composition can be achieved by means of more readily available and less expensive materials and whereby the performance of the electrically conductive composition is substantially unvaried over a prolonged period of use.

Thus, it has been found that when preparing epoxy resins, the curing agent plays a significant part; the use of a particular copper particulate is indicated as necessary; the preparation of the copper particulate must be carried out in a particular manner; and the use of complementary conducting particulate materials must optionally be employed in order to achieve the desired long term reliability for the intended purposes.

DETAILED DESCRIPTION OF THE INVENTION AND DISCLOSURE OF THE EMBODIMENTS

Inasmuch as copper filled epoxy resin compositions offer a significant cost advantage over silver filled materials because of the relative availability of copper, it had been expected that copper filled conductive epoxies would be generally available. However, the reverse has been true. One of the major reasons for the lack of copper filled conductive epoxies which would be suitable for the intended purposes is that copper readily oxidizes and thus high conductive resins cannot be made, such as copper filled epoxy resins.

With respect to using copper, it has been found that not only the particulate material employed is important, but that copper flake must be used rather than powder. The flake gives less surface area per unit of volume and thus improved particle-to-particle contact is established. However, a copper flake, contrary to the teaching in the prior art such as in the U.S. Pat. No. 3,412,043, pertaining to silver flake cannot tolerate the presence of undesirable surface coatings, such as existing oxides formed by corrosion and organic matter deposited on the flake as a result of the manufacturing process.

a. PREPARATION OF COPPER FLAKE

It has been found that in order to produce conductive copper epoxy resin compositions, careful cleaning of the copper flake is essential. Thus, the cleaning requires that copper flake is subjected to a cleaning action by a proper cleaning agent, which is capable of removing the surface deposits. It has been found that flake particulates such as Belmont's Smelting and Refining Company's No. 250 flake copper, a 250 mesh approximately 58 microns particle size copper flake with a purity of at least 99.99% copper, must be carefully prepared for obtaining the desirable characteristics. Copper flakes having a particle size of 30 to 200 microns are suitable. The copper flake thus described are mixed with enough of a solvent such as chlorinated alkylenes, e.g., trichloro ethylene whereby eight volumes of a solvent are used per volume of flakes. Higher ratios can be used such as up to 12 volumes of solvent per volume of flakes, but it has been found that generally, sufficient cleaning is achieved by utilizing additional aliquot parts rather than employing greater amounts of the solvent. For example, using a solvent to flake ratio of 5:1 and repeating the process it has been found that the cleaning action is enhanced.

The obtained mixture is stirred for about ½ hour and then filtered through an appropriate filter device such as a Buchner funnel. After filtering of the flakes, these are rinsed in the funnel several times such as with denatured alcohol, methyl alcohol, or ethyl alcohol. After the first step, the copper flakes, while still damp with alcohol, are removed from the funnel and mixed with about 1 quart of 1 molar citric acid and stirred continuously for a prolonged time, e.g., for about 12 hours. This mixture is then again filtered in the funnel and rinsed thoroughly with distilled water until the rinse solution is clear. Again, the flakes are rinsed with denatured alcohol and filtered to remove the excess fluid. Drying of the damp copper flakes is carried out in a vacuum oven and generally a temperature at about 100°F is employed. It has been found that the flakes are dry and powdery after drying, but it is important that these are stored in a clean dry container until ready for use. It is also important that moist air be excluded from the storage vessel because of the tendency of copper to oxidize readily.

It has also been found that if the copper flakes are mixed with the resin but the resin is not cured promptly, some degradation of the flakes appears to take place with time. Thus, panels made and cured the same day had an average volume resistivity (to be defined further herein) of 0.013 ohm-cm. Panels cured the next day from the same batch had a volume resistivity of 0.060 ohm-cm; and a panel made from the same resins three days later had a volume resistivity of 1.00 ohm-cm. Thus, it is important that not only the copper flakes are used immediately, but that curing is also effected immediately.

In addition, copper flakes, as against copper particulate, have better particle-to-particle contact characteristics and apparently, migration in the resin is less pronounced.

The purity of the copper flakes seems to affect the conductivity of the resins. Reproducability of the results is also affected by purity of the copper flakes. Thus, a batch of copper flakes, which were cleaned as identified above and which had an average impurity level of 7,650 ppm (parts per million), when used in 30 weight percent, copper flakes, filled in an epoxy resin panel had a volume resistivity of 0.327 ohm-cm, whereas, when the same resin was filled with the same amount of copper flakes, which had a purity of 1,270 ppm, a panel with the purer flakes had a volume resistivity of 0.158 ohm-cm.

Although the exact reason is not known and the applicants do not wish to be bound by a postulation, it appears that the lower inherent conductivity (higher resistivity) could be attributable to some form of nonconductive oxide coating formation on the surface of the copper flakes in the environment in which it is being used, i.e., epoxy resins, (originating in part from the impurities). It is likely that the detrimental contribution from the impurities is enhanced.

Inasmuch as the surfaces of the copper flakes are coated with a layer of stearic acid or some equivalent during the production process, such as by ball milling, it is necessary, contrary to what the prior art has said about silver flake, that this coating be removed by using a suitable solvent.

Useful solvents mentioned are ether, such as dimethyl ether, diethyl ether, haloalkylene solvents such as chloroalkenes, e.g., from 1 to 3 carbon atoms, e.g., trichloroethylene, which is preferred.

Other solvents are ketones such as acetone and methyl ethyl ketone, and aromatics such as benzene and toluene.

Again, as mentioned above, it is necessary that the flakes be treated in an acid solution such as citric acid for at least a period of 10 to 24 hours (1 molar solution; higher acid concentration in the solution requires less time). Other acids suitable for the purpose are dilute nitric acid (about 5% by weight), tricarballylic acid, tartaric acid and similar polycarboxylic acids, i.e., aliphatic carboxylic acid having from 1 to 4 carboxylic groups and from 0 to 4 hydroxy groups and ranging from 3 carbon atoms (tartonic acid and tricarballylic acid) and up and, in general, an aliphatic acid of at least 2 carboxylic groups.

The concentration of the acid in the solvent should be from 0.1 molar to a saturated solution although concentrations greater than about 2 molar are probably wasteful. The importance of the cleaning operation has been established when clean flakes prepared by the method described above have been left exposed to air for a few days. These rapidly oxidize and when the copper flakes are incorporated into the epoxy matrix, the result is a nonconductive composition.

b. COPPER FLAKE CONTENT IN THE RESIN

As expected, the conductivity of a suitable test panel increases with increased copper flake content. (In the context of prior art designation, the term "copper flake" and "copper flakes" are used as synonyms.) However, there is a minimum loading value of about 25 weight percent copper flake. Below 25 weight percent copper flake in the resin, a sharp drop in conductivity occurs.

It appears that the particle-to-particle contact ceases to exist at some point when less than 25 percent by weight of copper flake is used per unit weight of resin. Thus, volume resistivity varied by the methods employed herein from as low as 0.0015 ohm-cm to an essentially nonconductive material at less than 20 weight percent of copper flakes. The high loading compositions are generally in the vicinity of 60 percent by weight, copper flakes, to 40 percent by weight, resin, but these can be higher, such as 70 percent. However, viscosity and handling problems essentially confine the copper flake amount of loading to 60 percent by weight and less. Although variability between identical batches has been experienced, it is probably attributable to the lack of uniformity in dispersion or distribution of the flake within each of the resin batch and the formed shape. Some of the variations may also be accounted for by the error involved in measuring very accurately the thickness of the conductive resin panel. It is preferrable that the copper flakes be added to the resin portionwise as the mixing is carried out.

As mentioned above, the distribution of the flake within each of the resin batch appears to be fairly important. As one means to minimize the distribution problem and to improve the total combination, a 5 to 10 percent by weight incorporation of a conductive carbon black can be made. A typical carbon black might be a carbon black such as Cabot Corporation's carbon black designated as XC-72. This type of carbon black consists of particles about 30 millimicrons in diameter which link together to form chains. It has the lowest density of Cabot Corporation's carbon blacks and the highest surface area (about 6 lbs. per cu. ft. and 254 sq. meters per gram, respectively). Similarly, carbon black may be incorporated to replace some of the copper flake for the purpose of reducing the conductivity of the mixture when it is a desirable necessity. Still further, carbon black resin has a side benefit of masking the copper color if it is necessary to do so. In addition, the smaller carbon black particles appear to fill the interstitial space between the copper flakes and thus assure better contact and hence conductivity.

c. EPOXY RESINS AND CURATIVES THEREFOR

As suitable epoxy resins, the bisphenol A based epoxy resins are freely available in the trade such as the Epon series of resins available from Shell Chemical Co., Araldite Series of resins available from Ciba-Geigy Corporation are also useful. For purposes of easy workability, tractable resins are more desirable. Resins, which can be readily rendered tractable by heating or which can tolerate a slight amount of dilution, can also be employed. However, any additional steps, which are incorporated in the procedure of admixing a less tractable resin with the copper flakes, render the dispersion problem mentioned above more acute and hence, the tractable resins are suggested as a preferred embodiment. A tractable resin is defined as a resin which is liquid at room temperature.

Epoxy resins of the bisphenol A-epichlorohydrin or epoxy novolac or cycloaliphatic types may be used. These are fully described in the available literature and can be readily purchased.

AS curative for the resin, a polyamide such as Versamid 140 produced by General Mills is suitable. Versamid 140 is a liquid linear polymer derived from the condensation of a dimeric fatty acid with polyamine to form a long chain polyamide. Other polyamides used for curing epoxy resins could also be used. Such resins are equivalent to Dow Chemicals, D.E.H. 25, D.E.H. 14; Ciba-Geigy's Araldite 820, and Araldite 955 and any of the other amide type curing agents which are well known to those skilled in the art.

In addition, the following curing agents may be employed as curatives: diethylenetriamine, diethylaminopropylamine, triethylenetetramine, methyl 4-endomethylene tetrahydrophthalic anhydride, hexadrophthalic anhydride, and any of the other common amine or anhydride curing agents for epoxy resins.

The amine based resins are generally hard, brittle resins, hence the semiflexible polyamide cured resins have been found to be advantageous; for this reason, these are preferred.

In general, the ratio of the epoxy to the curative such as polyamide curative is 70 parts of epoxy to 30 parts of polyamide. However, ratios as low as 50 epoxy to 50 polyamide and as high as 80 epoxy-20 polyamide can be used. Other curing agents, i.e., the amines and anhydrides would be used in their normal proportions which are readily available in the literature. Thus, for example, for an amine curing agent, the literature suggests using 2 parts of amine up to 50 parts amine per 100 parts of an epoxy resin. A resin curing at room temperature and which would cure in about 16 hours is obtained by mixing 70 parts of bisphenol A based epoxy resin (trademarked Araldite 6005) with 30 parts Versamid 140 identified above. In general, the curing can be effected from room temperature or up to a temperature such as 250°F. Thus, the cure indicated above for room temperature, is achieved at 70°F for a cure period of 16 hours. Although the resins will harden within this time period, further curing will continue for several weeks or longer. Curing can be accelerated by adding small amounts of tertiary amines or by heating to about 150°F.

As mentioned before, anhydride cured resins are usually cured at a higher temperature such as for 2 hours at 200°F plus an additional overnight cure at 250°F and a post cure of 4 hours at 350°F. It has been found, however, that short and lower temperature cure conditions reduce the possible oxidation of the flakes and lower resistivities are observed. At cure temperatures above 250°F conductance of the resin is impaired.

In the table below, resin systems, which have been employed and the volume resistivities of a panel of 50 percent copper by weight, copper flakes to resin are set forth.

TABLE I

| | Resin System | Volume Resistivity |
|---|---|---|
| 1. | Bisphenol A epoxy Diethylene triamine | 0.0026 ohm-cm |
| 2. | Bisphenol A epoxy Diethylaminopropylamine | 0.0089 ohm-cm |
| 3. | Bisphenol A epoxy Triethylene tetramine | 0.0015 ohm-cm |
| 4. | Bisphenol A epoxy Methyl Nadic anhydride* Benzyl dimethylamine | 0.0187 ohm-cm |
| 5. | Bisphenol A epoxy Polyamide (Araldite 840) | 0.0167 ohm-cm |

*Methyl 4-endomethylene tetrahydrophthalic anhydride.

It has been surprising that the elevated temperature cure for resin 4, i.e., 2 hours at 250°F was found not to be unduly detrimental. However, longer cure times than 5 hours at 200°F do result in somewhat impaired conductivities.

d. FORMATION OF ELECTRICALLY CONDUCTIVE SHAPES

The copper epoxy resin mixture was prepared from a bisphenol A based epoxy resin (Araldite 6005) mixed with Versamid 140 in a ratio of 70 parts of epoxy to 30 parts of Versamid, cast onto either a plywood or a gypsum board as a layer in a thickness of about one-sixteenth inch. For large panels, guides along the panel edges were used to keep the thickness uniform. At either end of the panel, a strip of .0028 inch thick copper foil was used to make contact with the copper flakes in the epoxy resin mixture. Only half of the foil was covered by the resin and the copper wire was soldered to the other half to make the necessary electrical connection.

The panels were cured at room temperature or elevated temperature depending on the resin used and the size of the panel. The above-identified resin was cured at room temperature for 16 hours.

After curing, the panel was then measured for resistivity. The resistance between the foil contacts was measured with an ohm meter and the thickness of the panel was measured with a micrometer. The width and length of the composite between foil contacts was also measured.

The volume resistivity was then calculated by using the following formula: $R = \rho l/A$. Wherein R is resistance in ohms; l equals length between foil contact in centimeters; A equals the cross sectional area of the conductive resin in cm$^2$, and $\rho$ equals volume resistivity in ohm-cm.

Panels which were suitable for use as heating elements were connected to a voltage source and the voltage adjusted to produce a surface temperature of about 100°F. The voltage was kept constant and any change with the time of either surface temperature or resistance was noted. Panels, which have been prepared according to the above method have been running for as long as 1 year.

In addition to the above constant heating test, on-off cycling has been carried out by means of a conventional home type thermostat to determine what effect the cycling had on the operation of the panel. A proportional temperature controller device was also attached to another panel. This device controlled the flow of current to the panel. If the ambient temperature were well below that for which the controller was set, full current would flow through the panel; if there were only a slight difference, only a small amount of current would flow. This means for temperature control gave a smoother temperature response and eliminated abrupt on-off switching. Variations of the panel's electrical characteristics as a function of time were noted and were found to be acceptable.

The above panels were operated at voltages ranging from 2 to 110 volts depending on the conductivity of the panel. The panels were generally operated at a surface temperature of approximately 100°F. It was found that most of the panels could be operated at 20 volts or less. One of the advantages at lower voltages was that when operating at this range, insulation of the panels was not required by building code regulations, i.e., the electrical codes, because shock hazards are extremely low. For example, these panels are not dangerous if a nail were driven through the panel during its operation. If panels were to be employed operating at 110 volts, these must be insulated by some acceptable means, such as using a vinyl or polyester film. In addition, panels are made by mixing carbon particles such as Cabot Corporation's XC-72 with copper flake. These panels have a higher resistance than the all copper filled panels. Panels containing from 27 to 30 percent copper and from 3 to 8 percent carbon were prepared for operating at higher voltages. The electrical stability of these panels was superior to solely copper flake filled panels for the reasons outlined previously as long as the copper content was less than 50% by weight. At copper contents greater than 50%, the electrical stabilities were equal. In general, the volume resistivity of the carbon black-copper flake filled, conductive resin is greater than 0.001 ohm-cm and said resistivity is substantially constant for a period of at least 120 days at a surface temperature of about 100°F.

As the current flows through the conductive plastic, it generates heat. As long as the current is kept reasonably uniform across the panel and the temperature is kept sufficiently low to prevent thermal degradation of the plastic, the panel will continue to operate almost indefinitely. However, local overheating of the plastic can result in sharp increases in the panel's resistance and subsequent failure. For this reason, if the impurity or other characteristic of the copper flakes dictate, it is advisable to incorporate carbon black because the carbon black particles being relatively small, 50 microns or less, fill in some of the interstices between the copper flakes. As a result, local sparking (which may not be observed at all, but is suspected) may be avoided by lowering the resistance between adjacent flakes. In any case, it has been observed that the addition of carbon black seems to decrease the tendency of the panel's electrical characteristics to decay.

In view of the above, it should also be possible to vary the conductivity by reducing the copper content and/or by adding less conductive fillers such as carbon black. Thus, a wide range of products can be prepared having different operating characteristics and thus, heating panels, for example, could be operated at high or low voltages depending on the composition.

As an illustration of a panel, in FIG. 1, the resistance in ohms and a surface temperature has been illustrated as a function of time. It is interesting to note that a fairly low loading of 28 percent copper by weight and containing 7 percent of conductive copper carbon black, Cabot Corporation's XC-72, the long term stability of the panel is fairly evident. In FIG. 2, the same data as in FIG. 1 are given for a full length 7 foot by 1 foot panel. It has been tested containing 50 percent copper flake. This panel size is a size used in ceiling type radiant heat panels and illustrates the advantageous properties obtained by employing the novel combination of elements.

The radiant heating panels, which have been illustrated above, such as those made with copper filled epoxy resins and cured with the necessary curing agents, use thermal radiation as a heat transmitting mode. When the thermal radiation is absorbed, a temperature of the absorbing body increases; thus, the average temperature of the floor or the walls and ceiling is increased. The emmission of the radiant heat from the body of an occupant is thereby reduced since the air in the room is usually cooler than the walls, floor, or ceiling. According to this system of heating, the occupant feels warm and comfortable while, at the same time, enjoying the proximity of refreshingly cooler air. Radiant heaters are usually placed in the ceiling, but may also be placed on the walls or floor. Of course, not all heat produced by such panels is radiant heat. When a panel is located on the ceiling, the radiation produces 70 percent of the heat and 30 percent is produced by convection.

The advantages, which are evident from using radiant heat instead of gas or oil heat are: the electrical heat generating source can be controlled at the combustion site for its emission control; heating panels do not interfere in any way with the desired placement of rugs and furniture; the floors are warmer; individual temperature control (and thus overall savings) is possible for each of the rooms; reduced maintenance is self-evident, there are no furnaces, valves, or dampeners which need to be manipulated or maintained; and air currents have smaller velocities and hence, reduce the movement of dust and disease causing organisms.

In addition to the above uses, the presently disclosed conductive resins lend themselves to numerous uses because the resin can be conformed to almost any shape. Consequently, these resins find uses in heating elements suitable for chemical tanks or certain instruments which need to be kept at a constant temperature.

The compositions are also ideal for defogging and deiceing and snow melting applications. Inasmuch as the temperature which is needed for these purposes is low, the life of the conductive epoxy resin composition should be correspondingly long; hence, this use suggests itself very readily. The epoxy composite itself (especially if overcoated) is immune to most chemicals and is capable of withstanding severely corrosive conditions. In general, the above described panels have an output of 40 watts per ft$^2$ at voltages between 10 – 110 volts. Some of the test panels have been run as long as 12 months.

The other uses for the present devices are for warming trays, electrical shielding, antistatic coatings, and constant temperature devices for instrument components.

What is claimed is:

1. An electrically conductive resinous composition consisting essentially of a copper flake the surface of which has been cleaned by removing therefrom impurities and/or oxides, a resinous binder of epoxy resin, an amount of copper flake in said resinous composition being from 25 to 70 percent, the total impurities in said copper flake being less than 7000 ppm, said resinous composition being cured with a curative comprising a polyamide or an anhydride, or mixtures thereof in an amount of about 20 parts to 50 parts of curative to about 80 parts to 50 parts of resin, respectively.

2. An electrically conductive resinous composition consisting essentially of a copper flake the surface of which has been cleaned by removing therefrom impurities and/or oxides, a resinous binder of epoxy resin and as a conductivity improver for said copper flake, a finely divided conductive carbon black, an amount of copper flake in said resinous composition being from 25 to 70 percent and the amount of finely divided carbon black being from 0.8 percent to 10 percent by weight; the impurities in said copper flake being less than 7000 ppm, said resinous composition being cured with a curative comprising a) a polyamide or an anhydride, or mixture thereof in an amount of about 20 parts to 50 parts of curative to about 80 parts to 50 parts of resin, respectively, or b) an amine from 2 parts to 50 parts of curative per 100 parts of epoxy resin.

3. An electrically conductive cured epoxy resin composition consisting essentially of: as a cured resin component thereof, a bisphenol A epoxy resin, as a curative therefor a) an anhydride, or polyamide curing agent in an amount of about 20 parts to 50 parts of curative to about 80 parts to 50 parts of resin, respectively, or b) an amine from 2 parts to 50 parts of curative per 100 parts of epoxy resin; said epoxy resin comprising up to 75 percent by weight of the composite, and having as a conductive medium for said resin from 25 to 70 percent of a copper in a flake form; said copper flake having been cleaned by removing from the surface thereof oxides and surface deposits, the impurities of said copper being less than 7000 parts per million, said copper flake being incorporated in said resin substantially without exposure of said copper flakes to oxidizing conditions, and said resin being cured substantially shortly thereafter, said composition optionally including from 0.8 to 10 percent by weight of a conductive carbon black particulate as an electrical contact improver between said copper flakes, the volume resistivity of said electrically conductive resin being greater than 0.001 ohm-cm and said resistivity being substantially constant for a period of at least 120 days at a surface temperature of about 100°F.

4. In a method for improving the electrical conductivity of epoxy resinous compositions having copper flakes therein, the improvement comprising the steps of: washing copper flakes having a particle size of 30 microns to 200 microns and having total impurities of less than 7000 ppm with at least one solvent selected from the group consisting of trichloroethylene, perchloroethylene, chlorinated alkenes of 1 to 3 carbon atoms, ethers, ketones, benzene or toluene for at least 2 times; rinsing said washed copper flakes with a rinsing solvent selected from the group consisting of denaturated alcohol, methyl alcohol, ethyl alcohol; and washing said copper flakes with an aliphatic acid of at least 2 carboxylic groups for at least 1 time; or dilute nitric acid; rinsing said copper flakes with said rinsing solvent; drying of said copper flake and admixing said copper flake substantially immediately after drying thereof with an epoxy resin and curative therefor, said copper flake being 70 percent to 25 percent by weight of said composition; and immediately curing said epoxy resin-flake composite.

5. The process as defined in claim 4 whereby an amount of carbon black from 0.8 percent to 10 percent based on weight of the flake-epoxy composite is incorporated in the same to improve the conductivity of the electrically conductive resin composition defined above.

6. The process as defined in claim 4 and wherein the aliphatic acid is citric acid.

7. The process as defined in claim 4 and wherein the aliphatic acid is a dicarboxylic acid having at least 1 hydroxy moiety.

* * * * *